(12) United States Patent
Tonomura et al.

(10) Patent No.: US 6,967,282 B2
(45) Date of Patent: Nov. 22, 2005

(54) FLIP CHIP MMIC ON BOARD PERFORMANCE USING PERIODIC ELECTROMAGNETIC BANDGAP STRUCTURES

(75) Inventors: Samual D. Tonomura, Rancho Palos Verdes, CA (US); Terry C. Cisco, Glendale, CA (US); Clinton O. Holter, Long Beach, CA (US)

(73) Assignee: Raytheon Company, Waltham, MA (US)

( * ) Notice: Subject to any disclaimer, the term of this patent is extended or adjusted under 35 U.S.C. 154(b) by 29 days.

(21) Appl. No.: 10/794,491

(22) Filed: Mar. 5, 2004

(65) Prior Publication Data

US 2005/0194168 A1   Sep. 8, 2005

(51) Int. Cl.[7] .............................................. H05K 9/00
(52) U.S. Cl. .................... 174/35 R; 174/255; 174/260; 257/659; 257/778
(58) Field of Search ................................ 267/659, 778; 174/35 R, 35 MS, 255, 260; 361/816, 818, 361/800

(56) References Cited

U.S. PATENT DOCUMENTS

| | | | | |
|---|---|---|---|---|
| 4,891,468 A | * | 1/1990 | Andrae | 174/35 MS |
| 4,932,755 A | * | 6/1990 | Holdridge et al. | 359/896 |
| 5,017,419 A | * | 5/1991 | Smith | 428/209 |
| 5,455,116 A | * | 10/1995 | Nagano et al. | 428/545 |
| 5,455,117 A | * | 10/1995 | Nagano et al. | 428/545 |
| 6,147,302 A | * | 11/2000 | Matsuo et al. | 174/35 R |
| 6,599,681 B2 | * | 7/2003 | Gilson | 430/321 |
| 2003/0010529 A1 | * | 1/2003 | Sievenpiper et al. | 174/255 |
| 2004/0000416 A1 | * | 1/2004 | Hou | 174/35 MS |
| 2005/0016746 A1 | * | 1/2005 | Sze et al. | 174/35 R |

* cited by examiner

Primary Examiner—Hung V. Ngo
(74) Attorney, Agent, or Firm—Leonard A. Alkov; Karl A. Vick

(57) ABSTRACT

A hybrid assembly having improved cross talk characteristics includes a substrate having an upper surface. Conductive paths on the upper surface are provided for conducting high frequency signals. Regular polygons made of an electromagnetic band gap (EBG) material having slow wave characteristics are deposited on the upper surface and form a lattice for tessellating the upper surface. Each of the polygons has a periphery. The polygons are separated along their periphery from adjacent polygons by an interspace and are covered with an insulating material. Second polygons, also made of an electromagnetic band gap material, are deposited over the insulating material. Semiconductor structures are mounted over the second polygons. The semiconductor structures have a plurality of electrical contacts with the conductive paths. The regular polygons can be hexagons, triangles, octagons or any other combination that forms a lattice and can be printed onto the substrate.

29 Claims, 9 Drawing Sheets

FLIP CHIP MMIC ON BOARD PERFORMANCE USING PERIODIC ELECTROMAGNETIC BANDGAP STRUCTURES

BACKGROUND OF THE INVENTION

1. Field of Invention

This invention is in the field of cross—talk suppression in a hybrid assembly at microwave frequencies.

2. Description of the Related Art

Monolithic Integrated Circuits (MMIC), an example of a semiconductor structure, support many of the present generation of military and commercial radio frequency sensors and communication applications. MMICs include active devices, such as field effect transistors and bipolar transistors, passive elements such as capacitors, thin film/bulk resistors, and inductors integrated on a single semi-insulating substrate, such as Gallium Arsenide.

Hybrid technology relates to methods used for interconnecting a plurality of separate semiconductor structures, such as MMICs, to a host substrate, in single, or multi-layer configurations. In a hybrid, inter-connections between the semiconductor structures is sometimes along the surface of the host substrate. These inter-connections are frequently made using metallized paths connected to bumps (soft solder, or hard plated bumps). These bumps, located on the surface of the substrate, engage conductive pads on the semiconductor structures thus forming conductive, interconnecting paths between the host substrate and the semiconductor structures. The bumps are used as a substitute in place of wire bonds for connections. The advantage of bumps over wire bonds include the elimination of wafer backside processing steps such as wafer thinning, via formation, and metal deposition.

Another advantage to using surface bumps for interconnection purposes is the lower thermal resistance between the semiconductor structures and the host substrate. The lower thermal resistance of the bump connection is due to the relatively large surface area of contact between the host substrate and the semiconductor structures. Heat transfer is also facilitated by the large diameter and short length of the bump, as compared to a wire interconnect. Although both the bump and the wire are made of thermally conductive metal, the favorable aspect ratio of the bump and wider surface area present a lower thermal resistance as compared to a typically thin, long wire bond. The lower thermal path presented by the bump facilitates the conduction of heat away from the semiconductor structures, allowing higher power density for the semiconductor/substrate hybrid assembly, especially when using thermal bumps directly under heat sources. The higher power density allows higher performance for the hybrid.

Yet another advantage of using bumps for interconnect purposes is the elimination of parasitic effects such as capacitance, inductance and radio emissions present with wire bonds and vias. At high frequencies, the thin, long wire bonds, and the vias traversing the thickness of the substrate can be considered as antennas for the emission of electromagnetic interference. The same wires and vias present capacitance to adjacent structures, as well as an inductance to the signals transmitted by the wires.

Other advantages of bumps are their lower cost and higher reliability. Typically bump type connections can be efficiently completed using a single epoxy cure/solder reflow die-attach process. This presents fewer steps during manufacture as compared to wire bond techniques. With bump interconnect, there are no mechanical wire connections to shake loose, be intermittent or fail due to thermal cycling.

While bumps are advantageous as compared to wire inter-connections, their presence between a semiconductor structure and a host substrate presents unique electromagnetic resonance and emission packaging problems. First, there is the optimization of the vertical radio frequency interconnect transitions presented by the interface between the bumps on the host substrate and the semiconductor structure mounted thereon. Then there is the potential electromagnetic coupling effects presented at the interface between the semiconductor structure and the host substrate, as well as the host substrate opposing surfaces.

A particular difficulty introduced by the semiconductor structure mounted on the host substrate is the potential formation of electromagnetic boundaries which sup port unwanted, parallel plate, waveguide like (surface modes) of energy propagation. Such unwanted modes can propagate near the surface of the host substrate causing degradation in semiconductor performance because of signal interference. The degradation in semiconductor performance are caused by unwanted signal transfer among semiconductor structure inputs and outputs, affecting gain and phase response, loss of isolation between adjacent paths in multiple path/multiple channel circuit applications, and circuit instability. These negative effects are due to the introduction of unwanted coupling or feedback paths.

Maximum frequency operation of the semiconductor in the presence of these unwanted feedback paths are undesirably dependent on the dimensions of the semiconductor structure. Thus, semiconductor structures with large dimensions with respect to wavelength operating frequency present a potential difficulty. This difficulty is prevalent with fast Gallium Arsenide (GaAs) semiconductor structures mounted on a host substrate. The relatively large semiconductor size of GaAs as compared to the wavelength of the operating frequency approach the cutoff frequencies at the upper edge of the operational band. Near cutoff, the semiconductor structure may be functional, but unable to operate because the incoming signals are interfering with each other.

In the prior art, signal interference is reduced by incorporating grounded interconnect bumps strategically placed on the semiconductor structure surface to break up surface modes of energy propagation. By making direct contact to ground pads on the host substrate, the path of the surface modes is disrupted. These grounded interconnect bumps act like shields and attempt to change the path to be followed by the electromagnetic energy propagated along the surface of the host substrate. Unfortunately, because of semiconductor structure limitations and assembly requirements, this practice of using redundant ground bumps as obstacles to surface propagated electromagnetic waves results in a further increase in both semiconductor structure and substrate size, increasing weight, power consumption and reducing reliability of the resulting hybrid.

SUMMARY OF THE INVENTION

Above limitations are improved by a hybrid assembly comprising:

a substrate having an upper surface;

conductive paths on said upper surface for conducting high frequency signals along said upper surface of said substrate etched from a conductive layer initially deposited on the substrate; and first polygons made of a first electromagnetic band gap material on said upper surface, said first electromagnetic band gap material having slow wave characteristics in a first band, said first polygons forming a lattice for tessellating said upper surface, each of said first polygons having a first periphery at a first position; each of said first polygons separated along said first periphery from adjacent first polygons by a first interspace; said first polygons separated by a first distance from said conductive paths; each of said first polygons connected to a first conductive via, said first conductive via traversing said substrate and connected to said conductive layer on said lower surface of said substrate.

When using a single layer of EBG polygons, semiconductor structures are mounted over said first polygons. Said semiconductor structures have a plurality of electrical contacts with said conductive paths and are electrically separate from the EBG polygons.

If further attenuation of surface waves is necessary, an insulating layer is positioned over said first polygons. Second polygons are made of the same or of a second electromagnetic band gap material, and positioned over said insulating layer, tessellating the same area as the first polygons. Thus, the second polygons also form a lattice for tessellating said upper surface, just like the first polygons. Each of said second polygons has a second periphery at a second position and each is separated along said second periphery from adjacent second polygons by a second interspace. Each of said second polygons, as well as each of the first polygons, are connected to an individual, specific conductive via, said conductive via traversing said substrate and connected to said conductive layer on said lower surface of said substrate. The conductive layer is at ground potential.

Semiconductor structures are mounted over said second polygons. The semiconductor structures have a plurality of electrical contacts with said conductive paths but are electrically insulated from said second polygons.

The first and second polygons are hexagons, triangles, octagons, or any other regular polygon.

When two layers of polygons are used, the first and second polygons are centered at different positions. The position of the second polygons is separated from the position of the first polygons along the surface of the substrate by an amount greater than the first interspace. Typically, when the first polygons and second polygons are equal in width, and have equal shape and periphery, the second polygons are separated from the first polygons by ½ of the width of one first polygon. The first and second polygons can be the same or different. The size of the first polygons, hence their periphery, can be the same, larger or smaller than the second polygons.

DETAILED DESCRIPTION

The present invention describes an apparatus and method for improved cross talk suppression in a hybrid assembly by incorporating one or more layers made of electromagnetic band-gap (EBG) polygons on a hybrid substrate such as, for example, alumina, LTCC (low temperature co-fired ceramic) as well as HTCC (high temperature co-fired ceramic).

The EBG polygons reduce the cross talk induced by undesired surface/waveguide modes at high operating frequencies (10 to 20 Ghz) between input/output/power and ground pins on the operation of the hybrid.

Figure 1:
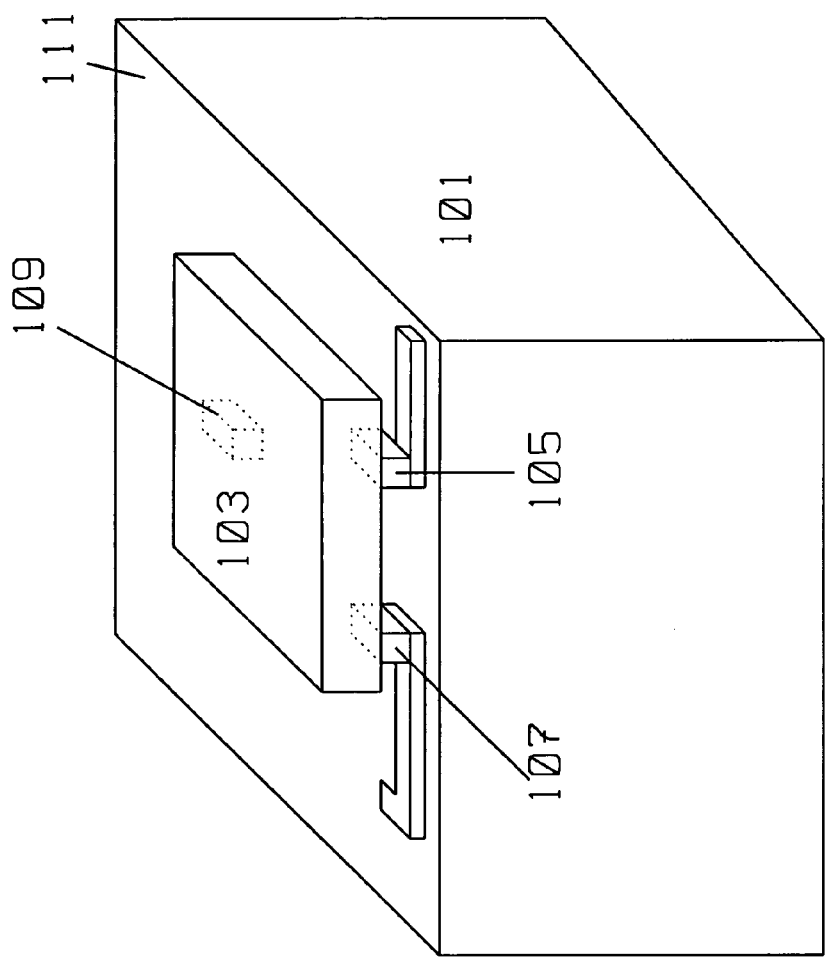
FIG. 1 is a typical configuration of the prior art where a semiconductor structure is mounted on a substrate using bumps for inter connection means.

FIG. 1 is a typical configuration of a hybrid of the prior art where a semiconductor structure 103 is mounted on the upper surface 111 of a host substrate 101 using bumps 105, 107 and 109 for inter-connection means. Substrate 101 has an upper metalization layer deposited on upper surface 111 of substrate 101. Conductive paths 113 and 115 are etched from a metalization layer, and interconnect bumps 105, 107 and 109 to their respective signal, ground or power sources. In turn, bumps 105, 107, and 109 form a continuous electrical path with pads (not shown) located on semiconductor structure 103, thus proving a path for conductively transferring the signal, ground or power from bumps 105, 107 and 109 to specific locations within semiconductor structure 103. An example of a semiconductor structure is a Monolithic Integrated Circuit, MMIC. The MMIC typically may comprise semiconductors, capacitors and resistors, as is well known in the art.

In the configuration of FIG. 1, at high frequencies (10 to 20 Ghz), signals propagate along the upper surface 111 of substrate 101. Upper surface 111 forms a waveguide like configuration with semiconductor structure 103. This waveguide like path tends to undesirably propagate high frequency signals from their intended destination. One mechanism for this undesired propagation are surface/waveguide modes along the interface of upper surface 111 of substrate 101 and semiconductor structure 109. For example, a signal meant for bump 105 may also be transmitted via surface/waveguide modes to an unintended point along upper surface 111, such as bump 107. Thus some of the signal present at bump 105 will also undesirably appear at bump 107 causing cross talk, interference thereby degrading hybrid operation. Bump 109 is similarly susceptible to high frequency signals from bump 107.

Figure 2:
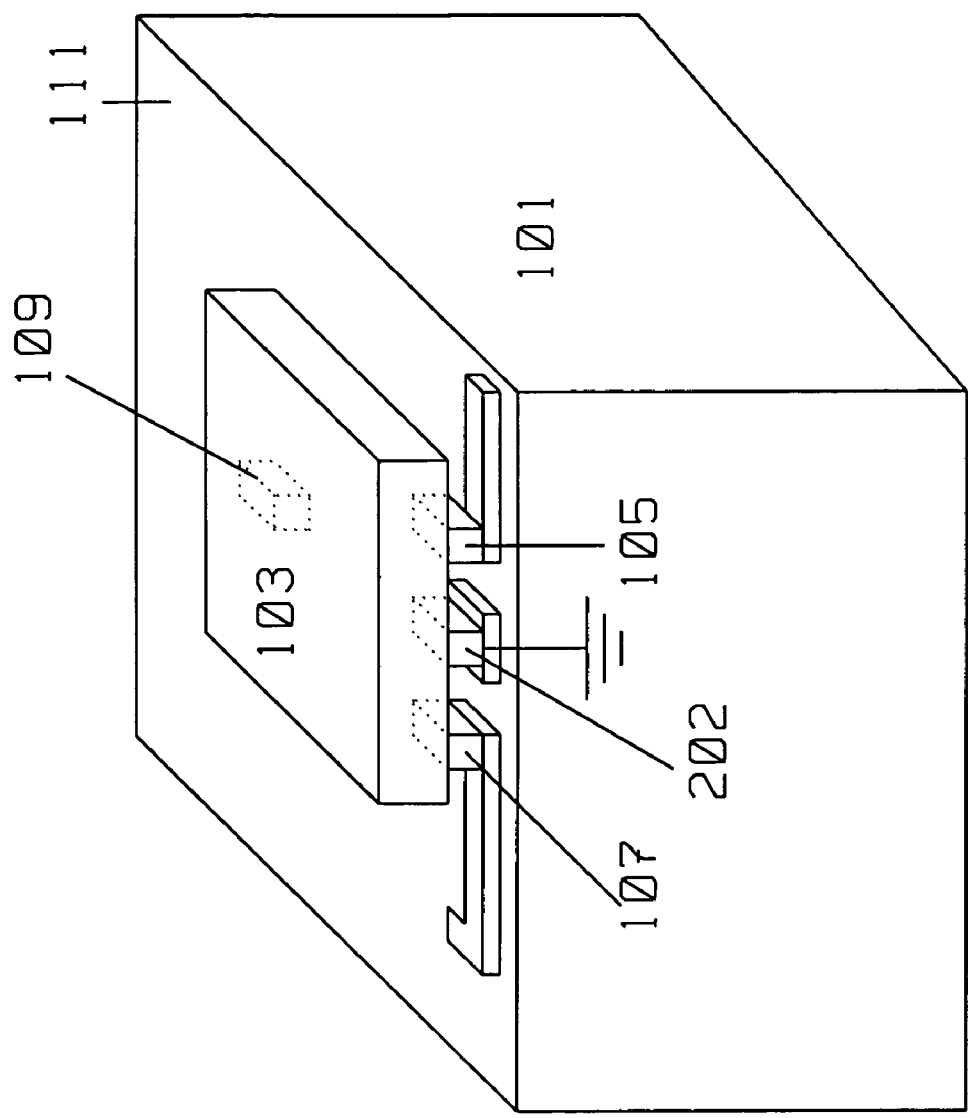
FIG. 2 is a typical configuration of the prior art where a redundant bump is used to minimize the undesired propagation of surface waves along an upper surface of a host substrate.

FIG. 2 shows a means of the prior art used to minimize undesired surface/waveguide mode propagation of signals from bump 105 to bump 107. Here, bump 202 has been introduced between bump 105 and 107 to avoid or minimize undesired propagation of electromagnetic energy via surface/waveguide modes from bump 105 to bump 107. Bump 202 is grounded, and effectively reduces the space between bump 107 and bump 105, thereby attenuating surface/waveguide mode energy that may reach bump 105 from bump 107. The introduction of bump 202, while minimizing unwanted electromagnetic energy transfer from bump 105 to bump 107, forces an increase in the surface area of substrate 101 as well as the physical dimensions of semiconductor structure 103. This increases costs and, because of increased size, further exposes semiconductor structure 103 to the reception of other, interfering electromagnetic energy. Furthermore, bump 202 does little to alleviate cross talk effects to bump 109.

For example, in the structure of FIG. 2, semiconductor structure 103 is Gallium Arsenide 25 mil thick, and substrate 101 is Alumina, 50 mil thick.

Figure 3:
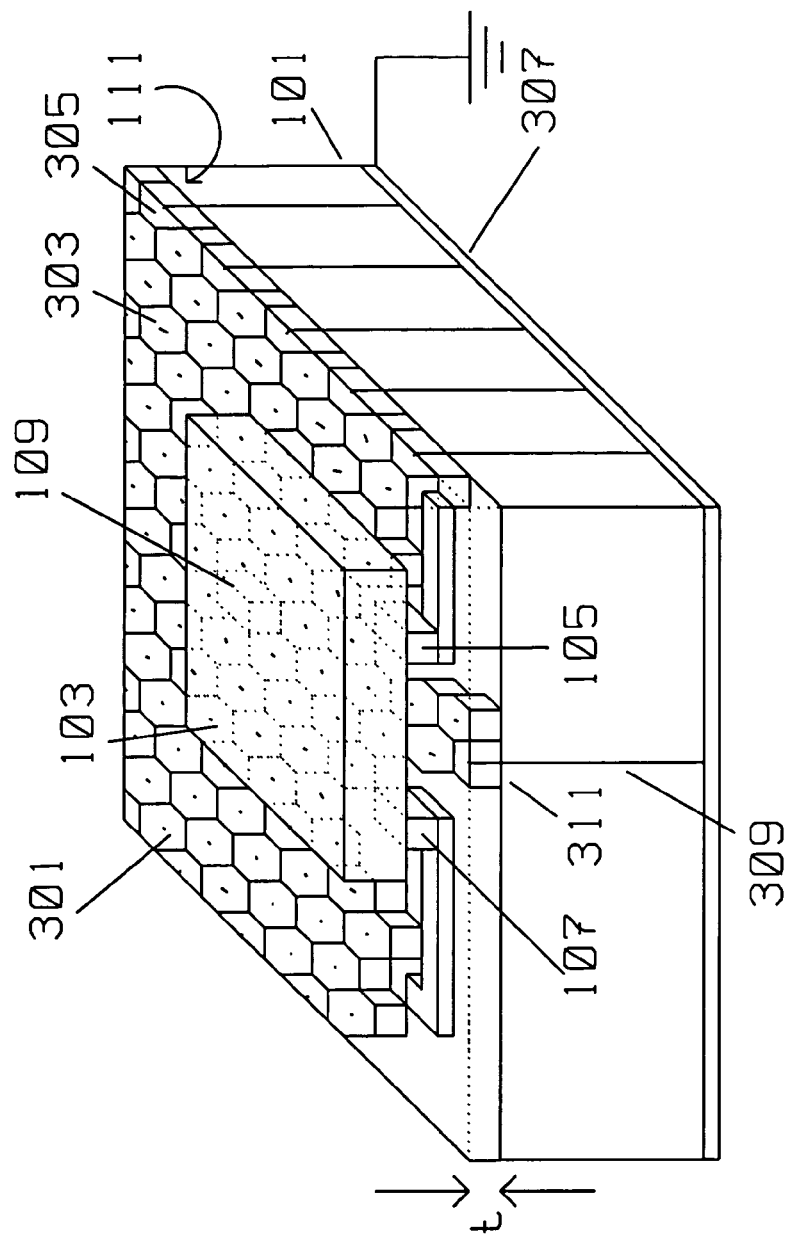
FIG. 3 is an exemplary configuration of this invention showing EBG polygons over an upper surface of a substrate, said EBG polygons electrically separate from conductive paths to an MMIC.

FIG. 3 shows an improvement over FIG. 2 in accordance with this invention. A periodic electromagnetic band-gap, EBG (sometimes referred to as photonic band-gap, PBG), lattice structure made of hexagons (regular polygons) exhibiting stopband and slow wave characteristics tessellates upper surface 111 of substrate 101 between signal bumps such as 105, 107 and 109. The hexagons are electrically separate from signal bumps such as, for example, 105, 107 and 109. This invention uses EBG lattice structures to minimize the propagation of electromagnetic energy using surface/waveguide modes in a specific frequency band of operation. As shown in FIG. 3, EBG lattice made up of hexagonal elements, such as 301, tessellates the upper surface of substrate 101. A plurality of hexagonal elements 301 form single layer EBG lattice structure 303, generally printed on substrate 101. Undesired signals traveling from bump 107 towards bump 105 now encounter the effects of the EBG lattice 303 and are attenuated. The thickness of lattice structure 303, shown as t, is, for example, in the order of 1 to 3 mils, depending on the type of ink used to print the lattice structure 303 onto substrate 101, the frequency band to be attenuated, physical dimensions of the semiconductor structure 103.

Each periodic element, or polygon of EBG layer 303, such as polygon 301 and polygon 305, is connected to ground plane 307 using a via. For example, via 309 connects polygon 311, part of EBG layer 303 to ground plane 307.

Two-dimensional (2D) and three-dimensional, multilayer (3D) EBG structures are applied on a single layer and/or multi-layer substrate technology. Uniplanar 2D EBG structures use one layer of metalization, whereas 3D EBG structures use multiple layers of metalization and substrate layers. EBG concepts presented herein are applicable to LTCC (low temperature co-fired ceramic) as well as HTCC (high temperature co-fired ceramic) technologies.

Figure 4:
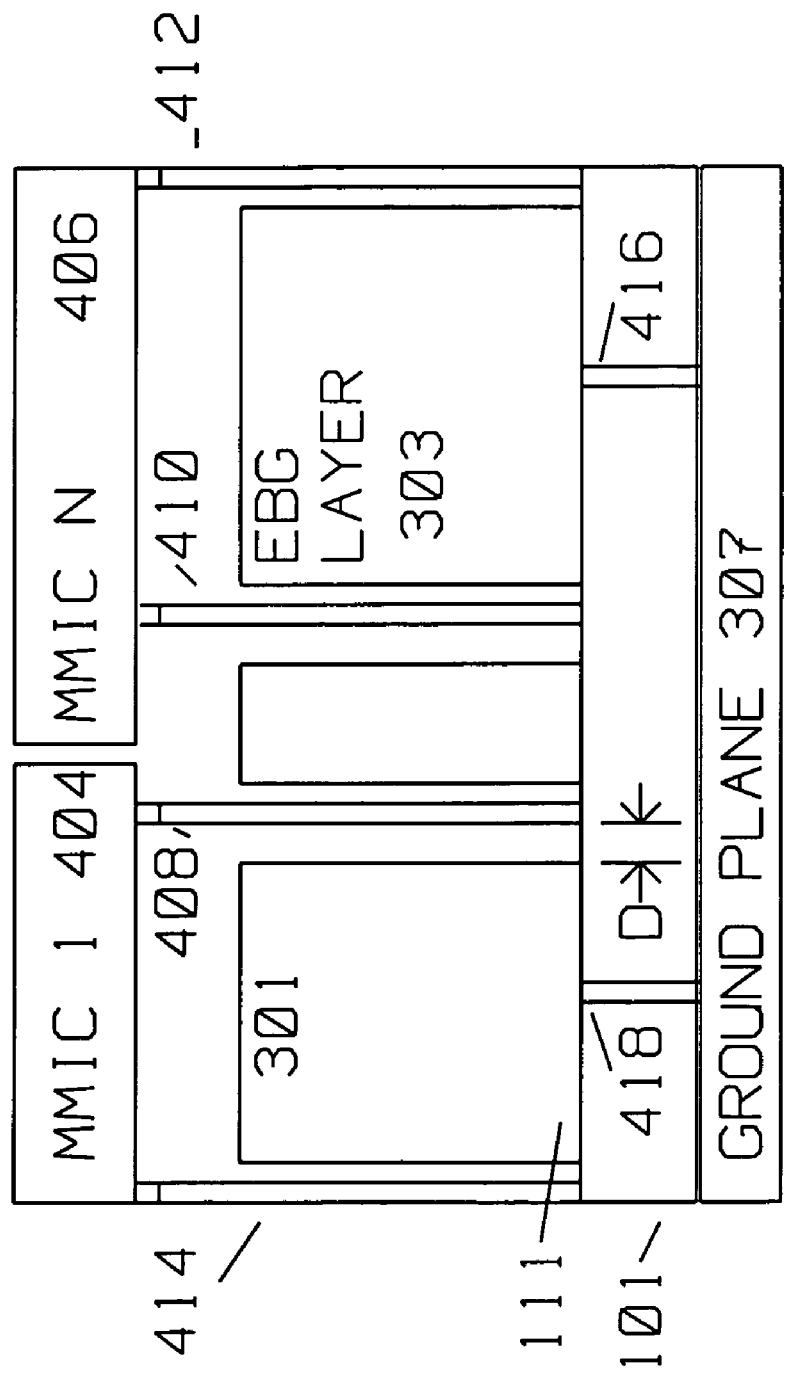
FIG. 4 is a cross section of an exemplary configuration of a hybrid of the present invention having EBG polygons over the upper surface of a substrate

A side view of the single layer EBG structure shown in FIG. 3 is further detailed in FIG. 4. In FIG. 4, EBG layer 303 is printed on upper surface 111 of substrate 101. A typical poligon 301 of EBG layer 303 is shown between bumps 414 and 408. Via 418 connects polygon 301 to ground plane 307. Via 416 is another example of interconnecting ground plane 307 to a hexagonal EBG polygon within EBG layer 303. There is a distance D between EBG element 301 and bump 408. Bump 408 is metallic, typically conducts signals, power or ground. D is a distance between the EBG layer element 301 and conductive bump 408. This distance D insures no direct electrical contact exists between element 301 and bump 408. Bump 410 and bump 412 interconnect with MMIC 406 located above substrate 101 and upper surface 111. Again, EBG layer 303 is deposited between bump 410 and 412 leaving a gap to preclude electrical contact.

Figure 7:
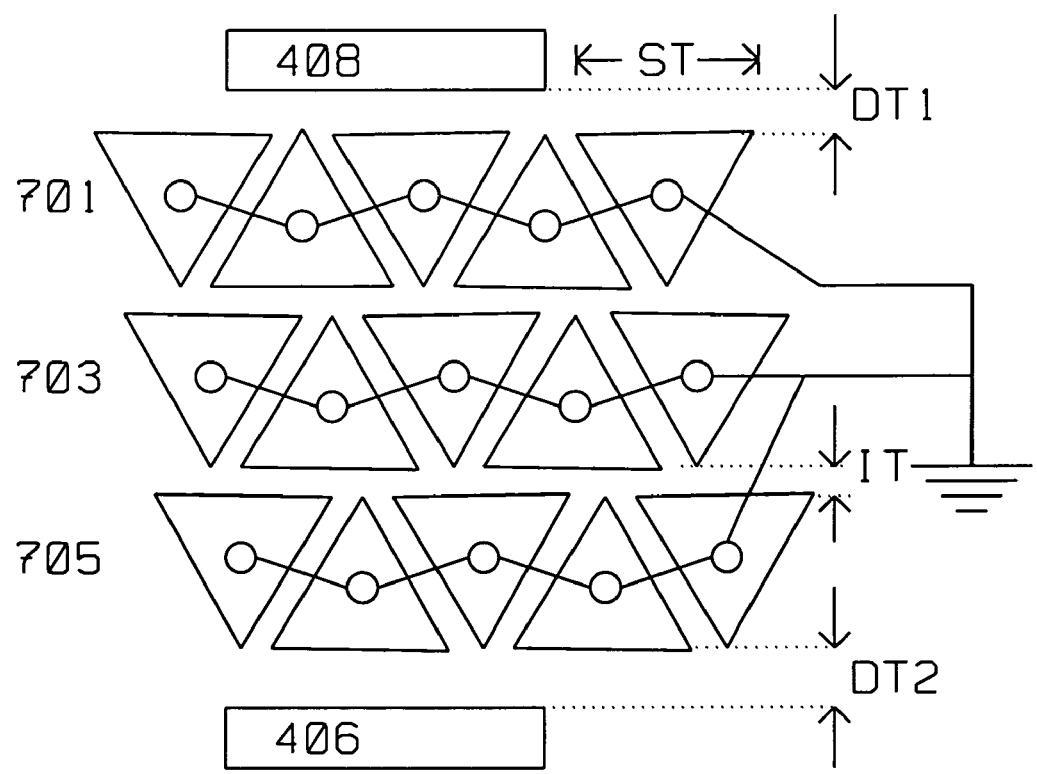
FIG. 7 shows a periodic lattice for tessellating the surface of a substrate using a periodic structure made of triangles.

Various periodic EBG structures are used with flip chip MMIC on substrate configurations. A multiple-layer, hexagon lattice (with vias) EBG configuration was found effective to suppress unwanted surface/waveguide electromagnetic propagation. This EBG structure is compatible with typical substrates and substrate fabrication techniques. A lattice of hexagonal building blocks tessellates the surface as shown in FIG. 3. Hexagonal building block 103 is one of many hexagonal elements, part of the lattice that tessellates the surface of substrate 101. Numerous other periodic EBG arrangements show equivalent performance benefits. For example, the surface of the substrate can be tessellated with a periodic lattice triangles as shown in FIG. 7, or a combination of polygons.

In the implementation shown in FIG. 3, a single layer periodic hexagon EBG lattice is used to tessellate an LTCC and/or Alumina substrate. Optimization of key parameters for single and multiple EBG layer hybrids includes hexagon physical dimensions, the spacing between adjacent hexagon unit cells on the same layer, and the overlap dimension between hexagon unit cells on different layers.

Figure 5:
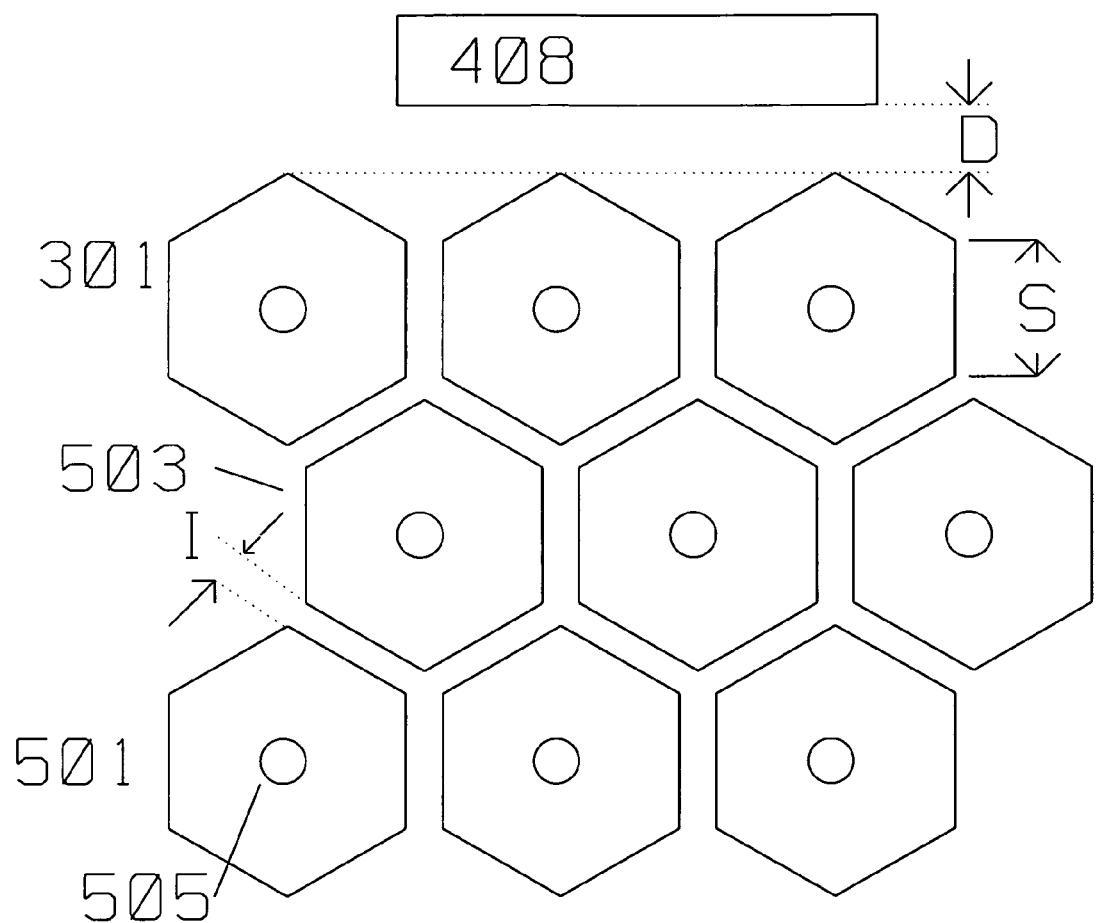
FIG. 5 shows a periodic lattice for tessellating the surface of a substrate using hexagons.

The chip-on-board configuration (CLC) provides practical restrictions on the physical dimensions of the periodic EBG structure shown in FIGS. 3, 4 and 5. Fabrication and die attached assembly limitations establishes restriction on the minimum physical dimensions of the hexagon geometry and spacing between hexagon unit cells. The flip chip CLC MMIC (top boundary condition) places a restriction on the maximum physical dimensions of an effective periodic lattice of hexagon cells since the efficiency of attenuating undesired energy is dependent on the quantity of hexagonal cells. Actual physical dimensions are computed from the operating frequency desired keeping in mind that the surfaces of the polygons can be viewed capacitively as a C. The vias present an inductance L at the frequencies of interest. The EBG materials also contribute to these factors. Therefore, the physical structure will be proportional to $\sqrt{LC}$.

Shown in FIG. 4 are flip chips 404 and 406 (typically GaAs CLC MMIC) mounted on a 25 mil, Alumina substrate 101. Vias 416 and 418 connected to the metalized layer 307 (forming the ground plane) are used to connect hexagonal EBG polygons from EBG layer 303.

Without the presence of a periodic EBG elements, typically surface modes are present at the substrate interface in the vicinity of MMIC 404 and MMIC 406. For an alumina substrate for example, the presence of these surface modes (leakage energy) is more pronounced near 19 GHz, and more dominant between the Alumina substrate and flip chip MMIC interface of MMIC 404 and MMIC 406. The E-field intensity has been found to be strongest directly above and directly inside the Alumina substrate interface.

Figure 8:
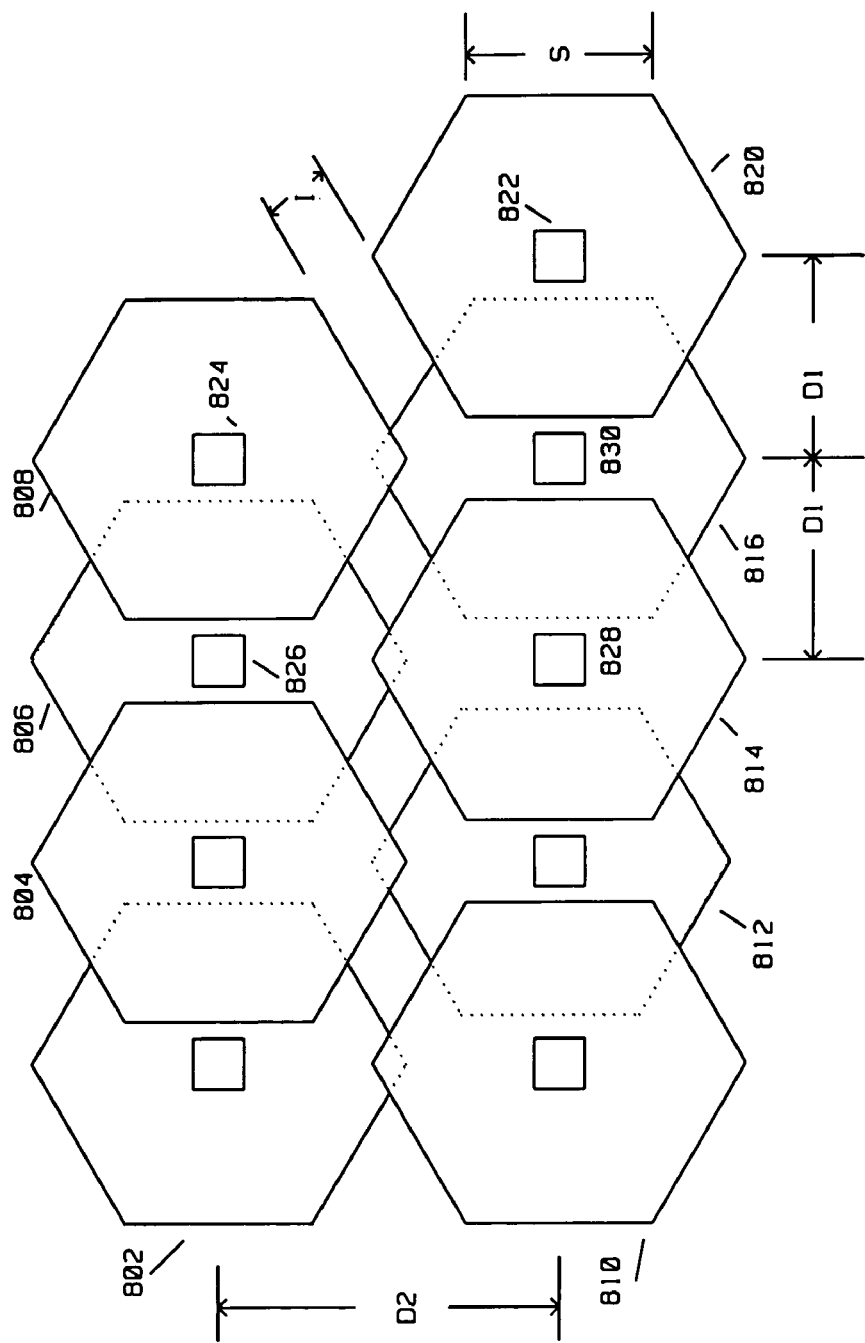
FIG. 8 shows two EBG layers made up of polygons used to tessellate the surface of a substrate, polygons of the first layer displaced with respect to polygons of the second layer along the substrate surface by an amount $D_1$.
Figure 9:
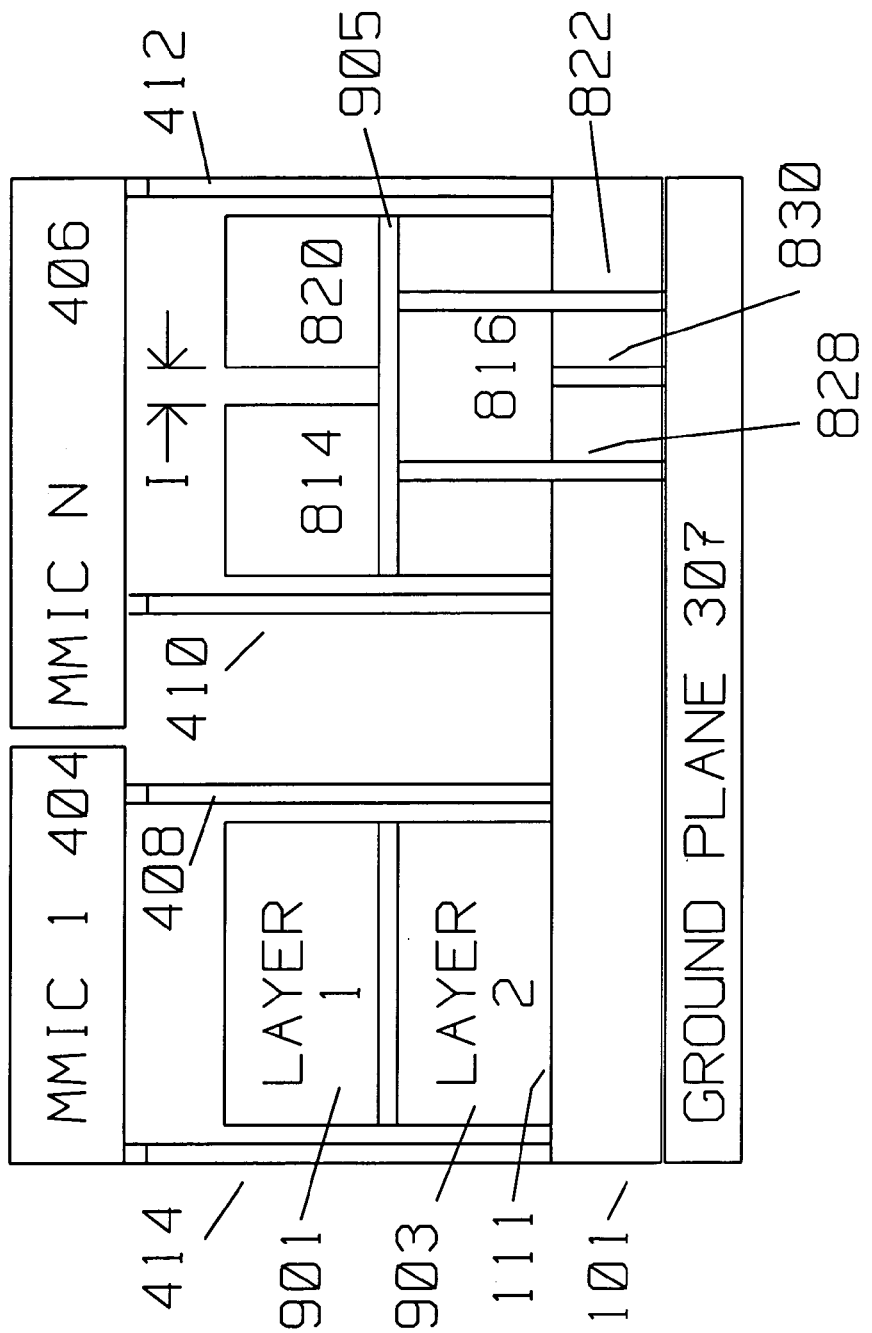
FIG. 9 shows a vertical cross section of hybrid using two layers of EBG polygons shown in FIG. 8.

With the presence of the a multi-layer periodic hexagon EBG surface detailed in FIGS. 8 and 9, the surface modes are still present at the Alumina substrate interface. However, a band-gap is introduced from about 14 GHz to 22 GHz. In fact, in the band-gap region, the isolation between ports such as 105 and 107 has been improved typically by 20 dB because of the EBG layer(s). Some isolation is lost at lower frequencies.

In actual operation, when using multiple EBG layers, the surface wave energy is reduced to a fraction of its value as it progresses down the electromagnetic band-gap structure. This demonstrates that partial patterning techniques are applicable with this configuration.

Phase shifters, filters, and low loss matching circuits for various amplifier applications can be realized with the insertion of the EBG boundary on the substrate.

FIG. 5 further details an EBG lattice formed from polygons, such as hexagonal EBG elements 301, 501 and 503. Element 301 is separated by a distance D from bump 408. Between each exemplary hexagonal EBG elements 501 and 503 there is an interspace I. Typically, depending on the frequency of operation the hexagons are 10 mils on the side S, D is 2 mils, while I is about 1 mil. Each EBG hexagon, such as 501 and 503, are connected to the ground plane using vias. For example, element 501 has via 505 centered with respect to the six sides of the polygon, and is made of a conductive material connecting the polygon to a ground plane, such as ground plane 307 (not shown in FIG. 5).

Figure 6:
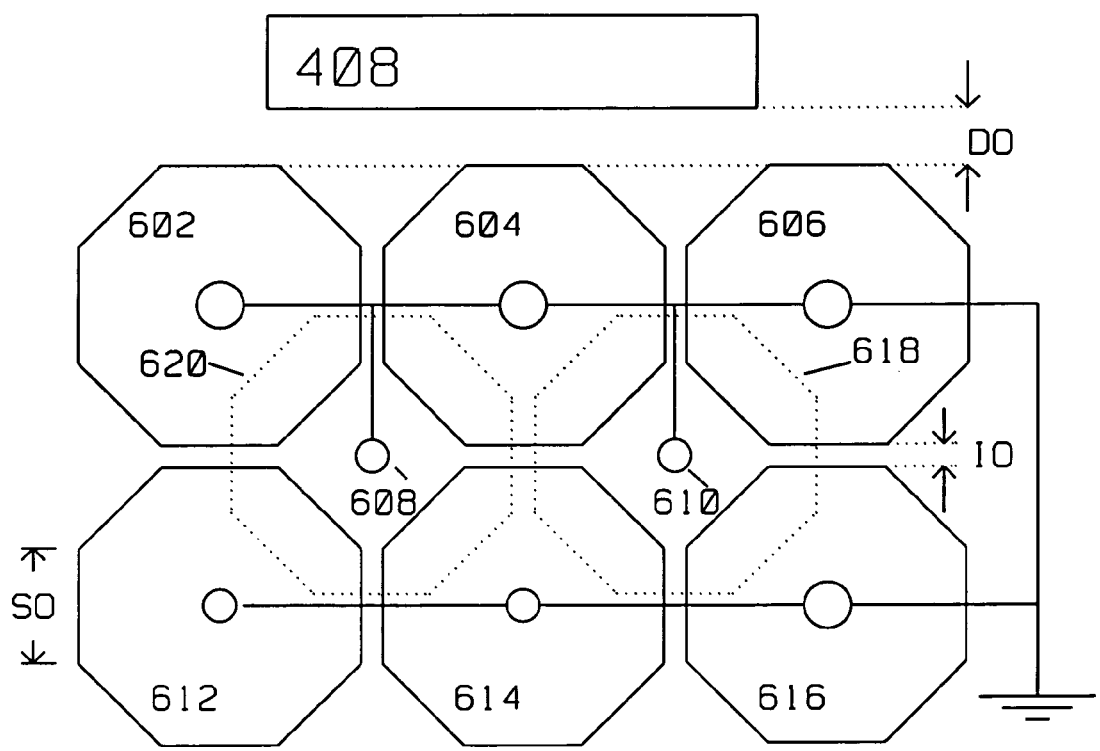
FIG. 6 shows a periodic lattice for tessellating the surface of a substrate using a periodic structure made of octagons.

FIG. 6 shows another example of polygons used in a lattice to tessellate the upper surface 111 of substrate 101 in either one layer, or two layer configurations. EBG Octagonal elements 602, 604 and 606 are separated by a distance DO from bump 408. EBG Octagonal elements 602, 604, 612 and 614 encircle via 608. Each side of the regular octagon is of size SO. Similarly, octagons 604, 606, 614 and 616 encircle via 610. An interspace IO is provided between adjacent octagonal EBG elements. Each octagonal EBG element 602, 604, 606, 614 and 616 is individually connected to the ground plane using vias. When two such layers as shown in FIG. 6 are used, the centers of the octagons of an upper layer register with their respective vias, 608 and 610 of the lower layer. This allows the vias centered in, and connecting the octagonal elements to the ground plane, to pass through the other layer without interfering with adjacent layers. Interspace IO is chosen to conform to the operating frequency of the hybrid and is typically proportional to the $\sqrt{LC}$ quantity presented by the geometry of the EBG/via structure. Where a second layer is used, the periphery of polygons forming the second layer is displaced from those of the first layer, as shown with octagons 618, 620.

FIG. 7 shows yet the application of yet another regular polygon applicable to the present invention using EBG triangular elements 701, 703, and 705. In single layer hybrid, the triangular elements are arranged to be spaced $DT_1$ from bump 408 and $DT_2$ from bump 406. $DT_1$ may be equal to $DT_2$. Interspace IT separates each triangular element of size ST. The center of each triangle forming a row of triangular elements is displaced with respect to the next so that no direct, straight line path exists between 406 and 408. For example, element 703 is displaced along the axis connecting bump 408 and bump 406 with respect to elements 701 and 705 by an amount approximately ½ST. Each EBG element has a central via interconnection to ground. In a two layer hybrid, the EBG triangles in the first layer are shifted with respect to the triangles of the second layer by an amount sufficient to allow passage of vias in the space IT without touching the EBG triangles of an adjacent layer.

Although many EBG structures were evaluated, substrates with the two-layer, periodic hexagon lattice embody the best mode of this invention. Using the concepts of hexagonal elements of FIG. 5, the band-gap for this two layer structure is optimized for the 14–20 GHz band. Shown in FIG. 8, a first EBG layer comprises sample hexagonal elements 804, 808, 810, 814 and 820, each having side size S. The centers of these hexagonal elements are laid out on a rectangular pattern $D_2$ by $_2D_1$. The pattern is duplicated until the area to be tessellated is covered, for example the top of the substrate, as shown in FIG. 3. A second EBG layer, comprising sample hexagonal elements 802, 806, 812 and 816 are below the first EBG layer, are typically of the same EBG material, and are also laid out on a rectangular pattern of the same $D_2$ by $_2D_1$ dimension. This second layer is separated by an insulator from the first layer and shifted by an amount $D_1$ from the first along the surface of the substrate, thereby allowing vias centered within hexagonal element, such, for example vias 822, 824, 826, 828 and 830 to traverse vertically the substrate without touching any of the EBG elements in adjacent EBG layers. The insulator is alumina, LTCC (low temperature co-fired ceramic) or HTCC (high temperature co-fired ceramic), from 1 to 4 mils thick.

Specific implementations optimize the shape, quantity, separation of polygons, such as 301, and volume fraction. The presence of one or more of EBG layer eliminates, or greatly reduces the propagation of electromagnetic energy using undesired surface modes that may exist during the operation of the hybrid. Using standard printing techniques, the incorporation of one or more layers of EBG periodic elements (polygons) onto the substrate 101 can be accomplished with little additional cost associated compared to the overall fabrication cost of the substrate.

The side view of the structure shown in FIG. 8 is further detailed in FIG. 9. Interspace I is shown separating upper layer hexagonal elements 814 and 820, part of layer 1, 901. Hexagonal element 814 is connected to ground plane 307 using via 828. Ground plane 307 is formed from a conductive layer positioned on the underside of substrate 101. Hexagonal element 816 is part of the lower layer, layer 2, 903, and is also connected to ground plane 307 using via 830, traversing substrate 101. Layer 2 is in contact with upper surface 111 of substrate 101. An insulating layer 905 separates layer 2, 903 from layer 1, 901. The insulating layer 905 is also shown between hexagonal element 814 and hexagonal element 816. The insulating layer, as described for FIG. 8, is made of alumina, LTCC (low temperature co-fired ceramic) or HTCC (high temperature co-fired ceramic).

Method

The method for manufacturing the hybrid assembly of this invention comprises the steps of:

a) forming conductive paths, connected for example to bumps 406 and 408, for conducting high frequency signals along an upper surface 111 of substrate 101;

b) forming first polygons, the first polygons made from a first electromagnetic band gap material on said upper surface 111. This forms the first EBG layer 303. The first electromagnetic band gap layer 303 has slow wave characteristics in a first band.

The first polygons form a lattice for tessellating said upper surface 111. Each of the first polygons has a periphery, each of the first polygons is separated along the periphery from adjacent polygons by an interspace I. The polygons are positioned so that they are separated by a distance D from conductive paths, for example, bumps 406 and 408.

c) forming an insulator layer over the first polygons.

d) forming second polygons over the insulator layer. The second polygons are made of a second electromagnetic band gap layer having slow wave characteristics in a second band. Said second polygons forming a lattice for tessellating said upper surface. Each of said second polygons has a second periphery at a second position; each of said second polygons separated along said second periphery from adjacent second polygons by a second interspace; said second electromagnetic band gap layer separated by a second distance from said conductive paths each of said second polygons connected to a second conductive via, said second conductive via traversing said substrate and connected said conductive layer on said lower surface of said substrate;

d) mounting semiconductor structures, such as 404 and 406 over said second polygons, said semiconductor structures having a plurality of electrical contacts with said conductive paths, said conductive paths, such as 414, 408, 410 and 412.

The polygons are, for example, hexagons as in FIG. 5, octagons as in FIG. 6, or triangles as in FIG. 7, in one or more layered configurations.

All references cited in this document are incorporated herein in their entirety by reference.

Although presented in exemplary fashion employing specific embodiments, the disclosed structures are not intended to be so limited. For example, although polygon examples of hexagonal, octagonal and triangular elements are described as periodic lattices for tessellating substrate surface 111, other geometric shapes can as well create a periodic lattice and their use embodies this invention. While one and two layer EBG structures are shown, the concept can be readily extended to a plurality of layers, each having particular polygons.

Those skilled in the art will also appreciate that numerous changes and modifications could be made to the embodiment described herein without departing in any way from the invention.

What is claimed is:

1. A hybrid assembly operating at an operating frequency comprising:
   a substrate having an upper surface and a lower surface, said lower surface covered by a conductive layer connected to ground potential;
   conductive paths on said upper surface for conducting high frequency signals along said upper surface of said substrate;
   first polygons made of a first electromagnetic band gap material on said upper surface, said first electromagnetic band gap material having slow wave characteristics in a first band, said first polygons forming a lattice for tessellating said upper surface, each of said first polygons having a first periphery at a first position; each of said first polygons separated along said first periphery from adjacent first polygons by a first interspace; said first polygons separated by a first distance from said conductive paths; each of said first polygons connected to a first conductive via, said first conductive via traversing said substrate and connected to said conductive layer on said lower surface of said substrate.

2. A hybrid assembly as in claim 1 wherein said first polygons are hexagons.

3. A hybrid assembly as in claim 1 wherein said first polygons are triangles.

4. A hybrid assembly as in claim 1 wherein said first polygons are octagons.

5. A hybrid assembly as in claim 1 wherein said first periphery of first polygons is inversely proportional to said operating frequency of said hybrid.

6. A hybrid assembly as in claim 1 wherein said first interspace along said periphery is inversely proportional to said operating frequency of said hybrid.

7. A hybrid assembly as in claim 1, further comprising an insulating layer positioned over said first polygons;
   second polygons made of a second electromagnetic band gap material over said insulating layer;
   said second electromagnetic band gap material having slow wave characteristics in a second band, said second polygons forming a lattice for tessellating said upper surface, each of said second polygons having a second periphery at a second position; each of said second polygons separated along said second periphery from adjacent second polygons by a second interspace; said second polygons separated by a second distance from said conductive paths each of said second polygons connected to a second conductive via, said second conductive via traversing said substrate and connected to said conductive layer on said lower surface of said substrate;
   semiconductor structures mounted over said second polygons, said semiconductor structures having a plurality of electrical contacts with said conductive paths.

8. A hybrid assembly as in claim 7 wherein said second polygons are hexagons.

9. A hybrid assembly as in claim 7 wherein said second polygons are triangles.

10. A hybrid assembly as in claim 7 wherein said second polygons are octagons.

11. A hybrid assembly as in claim 7 wherein said second position is separated from said first position by an amount greater than said first interspace.

12. A hybrid assembly as in claim 11 wherein said second interspace is equal to said first interspace.

13. A hybrid assembly as in claim 11 wherein said second polygons are the same as said first polygons.

14. A hybrid assembly as in claim 11 wherein said second periphery is equal to said first periphery.

15. A method for manufacturing a hybrid assembly comprising the steps of:
    forming conductive paths for conducting high frequency signals along an upper surface of a substrate;
    depositing first polygons on said upper surface, said first polygons made of a first electromagnetic band gap material, said first electromagnetic material having slow wave characteristics in a first band, said first polygons forming a lattice for tessellating said upper surface; each of said first polygons having a first periphery at a first position; each of said first polygons separated along said first periphery from adjacent first polygons by a first interspace; said first polygons separated by a first distance from said conductive paths; each of said first polygons connected to a first conductive via, said first conductive via traversing said substrate and connected to said conductive layer on said lower surface of said substrate.

16. A method for manufacturing a hybrid assembly as described in claim 15 further comprising the step of mounting semiconductor structures above said first polygons, said semiconductor structures having a plurality of electrical contacts with said conductive paths.

17. A method for manufacturing a hybrid assembly as described in claim 15 wherein said first polygons are hexagons.

18. A method for manufacturing a hybrid assembly as described in claim 15 wherein said first polygons are triangles.

19. A method for manufacturing a hybrid assembly as described in claim 15 wherein said first polygons are octagons.

20. A method for manufacturing a hybrid assembly as described in claim 15 wherein said first polygons are deposited on said upper surface using a printing procedure to tessellate said upper surface of said substrate with said first polygons.

21. A method for manufacturing a hybrid assembly as described in claim 15 further comprising the steps of:
depositing an insulating layer over said first polygons
depositing second polygons over said insulating layer, said second polygons made of a second electromagnetic band gap material;
said second electromagnetic band gap layer material having slow wave characteristics in a second band, said second polygons forming a lattice for tessellating said upper surface, each of said second polygons having a second periphery at a second position; each of said second polygons separated along said second periphery from adjacent second polygons by a second interspace; said second polygons separated by a second distance from said conductive paths, each of said second polygons connected to a second conductive via, said second conductive via traversing said substrate and connected to said conductive layer on said lower surface of said substrate;
mounting semiconductor structures over said second polygons, said semiconductor structures having a plurality of electrical contacts with said conductive paths.

22. A method for manufacturing a hybrid assembly as described in claim 21 wherein said second polygons are hexagons.

23. A method for manufacturing a hybrid assembly as described in claim 21 wherein said second polygons are triangles.

24. A method for manufacturing a hybrid assembly as described in claim 21 wherein said second polygons are octagons.

25. A method for manufacturing a hybrid assembly as described in claim 21 wherein said second polygons are deposited using a printing procedure.

26. A method for manufacturing a hybrid assembly as described in claim 21 wherein said first band is the same as said second band.

27. A method for manufacturing a hybrid assembly as described in claim 26 wherein said first periphery is the same as said second periphery.

28. A method for manufacturing a hybrid assembly as described in claim 27 wherein said first interspace is the same as said second interspace.

29. A method for manufacturing a hybrid assembly as described in claim 28 wherein said first interspace, said second interspace, said first periphery, said second periphery, said first electromagnetic band gap material and said second electromagnetic band gap material are chosen to form an attenuator at said operating frequency for unwanted signals traveling between said upper surface of said substrate and said semiconductor structures.

* * * * *